Oct. 11, 1966 HIROSHI MORI 3,278,811

RADIATION ENERGY TRANSDUCING DEVICE

Filed Oct. 3, 1961 2 Sheets-Sheet 1

INVENTOR
HIROSHI MORI
BY Eugene E. Geoffrey Jr.
ATTORNEY

RADIATION ENERGY TRANSDUCING DEVICE

Filed Oct. 3, 1961 2 Sheets-Sheet 2

INVENTOR
HIROSHI MORI
BY Eugene E. Geoffrey, Jr.
ATTORNEY 3,278,811

RADIATION ENERGY TRANSDUCING DEVICE

Hiroshi Mori, Abeno-ku, Osaka, Japan, assignor to Hayakawa Denki Kogyo Kabushiki Kaisha, Osaka, Japan, a company of Japan Filed Oct. 3, 1961, Ser. No. 142,599
Claims priority, application Japan, Oct. 4, 1960, 35/40,748
4 Claims. (Cl. 317—234)

This invention relates to radiation transducing apparatus and more specifically to an improved radiation transducer responsive to light, invisible light, rays emitted from radioactive substances and other similar types of radiation to produce electrical energy.

Known radiation transducing devices utilizing semiconductors usually have a single p-n junction. An electrode is connected to each of the layers and when radiant energy is directed toward the laminate a voltage is produced between the electrodes. It has been found that when radiation is applied to the side of the transducer having the p-n junction, relatively short wavelengths will be absorbed by the p-layer and produce pairs of positive holes and electrons in that layer. Relatively long wavelength radiation, on the other hand, reaches the n-layer and produces pairs of positive holes and electrons within the n-layer. The holes and electrons will diffuse through a predetermined distance, called the "diffusion distance," in their respective layers and upon reaching the p-n junction they will separate and in so doing will generate electrical energy. In the case of the n-layer, which is considerably thicker than the p-layer, the positive holes which occur in that portion of the n-layer spaced from the junction a distance greater than the diffusion distance will not be able to reach the p-n junction and therefore will not contribute in any way to the generation of electric power.

This invention has as one of its objects the provision of an improved rediation transducer having materially improved efficiency and which will perform substantially uniformly over a wide range of wavelengths.

Another object of the invention resides in the provisions of a novel and improved radiant energy transducer wherein a pair of p-n junctions are utilized.

A still further object of the invention resides in the provision of an improved radiant energy transducer which is sensitive to radiation applied to either side of the transducer.

A further object of the invention resides in the provision of an improved radiant energy transducer having a relatively low internal series resistance.

A still further object of the invention resides in the provision of an improved radiant energy battery.

The above and other objects and advantages of the invention will become more apparent from the following description and accompanying drawings forming part of this application. In the drawings.

Figure 1:
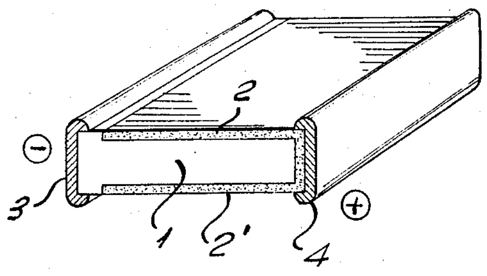
FIG. 1 is a side elevational view of a radiant energy transducer in accordance with the invention.

Referring to FIG. 1, the radiation transducer includes a relatively thick silicon layer 1 of the n-type and relatively thin p-layers 2 and 2' on each side of the layer 1. The layers 2 and 2' are joined about one edge of the layer 1, and the opposite ends of the layers 2 and 2' are spaced from the opposing edge of the layer 1. An electrode 3 is secured to the opposing edge of the layer 1, and an electrode 4 is attached to the connecting portion of the layers 2 and 2'. With this arrangement of the p- and n-layers the electrode 3 is negative while the electrode 4 is positive. If short wave-length radiant energy is directed toward the layer 2, pairs of electrons and positive holes will be produced in the layer 2 while in the case of long wave length energy the pairs of positive holes and electrons will be produced in layer 1.

In known transducing devices the thickness of the n-layer is substantially larger than the diffusion distance of the positive holes formed in the n-layer so that those holes which are disposed at a distance from the junction between the layers which is greater than the diffusion distance cannot reach the junction. With this invention a pair of p-layers are provided in the upper and lower sides of the n-layer so that if the thickness of the n-layer does not exceed twice the diffusion distance of the holes, then all of the holes formed in the n-layer will be diffused either to one junction or the other. Thus in effect the diffusion distance of the positive holes in the n-layer is lengthened and the electric current produced is materially increased.

Figure 2:
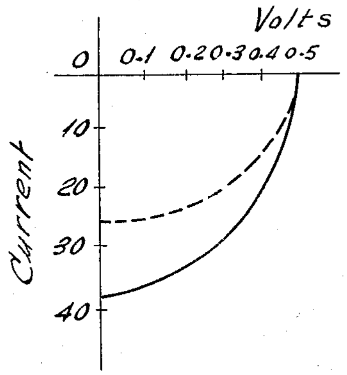
FIG. 2 is a graph showing the relationship of voltage and current in the embodiment of the invention illustrated in FIG. 1.

The characteristics of the improved transducer described above are illustrated in FIG. 2. In this figure the broken curve shows the current-versus-voltage relationship of known transducers while the solid line is the voltage-current curve of the transducer in accordance with the invention. From these curves it will be observed that current capabilities of the improved cell at various loads greatly exceed the capabilities of known cells.

Figure 3:
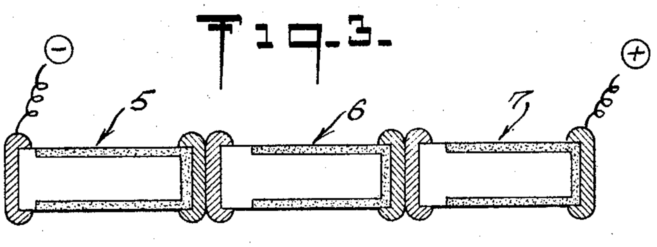
FIG. 3 is a side elevational view of an embodiment of the invention utilizing a plurality of transducers as shown in FIG. 1.

FIG. 3 illustrates a cascade arrangement of 3 transducers denoted by the numerals 5, 6 and 7, each of which is substantially identical to the transducer illustrated and described in connection with FIG. 1. Since the laminates can be placed in end to end relationship with the positive terminal of one laminate being connected with the negative terminal of the next laminate, it will be seen that an increased voltage will be obtained without interfering in any way with the reception of radiation by individual laminates. When utilizing transducers in series as shown in FIG. 3, if the n-layer has a relatively high specific resistance, then the total series resistance of the cascade device is apt to become too large. To maintain a relatively low specific resistance the n-layer may be made in the form of a lattice.

Figure 4:
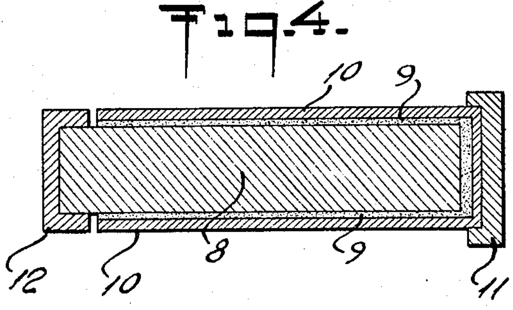
FIG. 4 is a cross-sectional view of another embodiment of the invention.

FIG. 4 illustrates a modified embodiment of the invention utilizing a composite construction. The silicon layer 8 is first formed of the desired shape and size and includes a very large density of impurities to provide a specific resistance of the order of .001 ohm per cm. Both faces of the layer 8 and at least one edge thereof are then covered by n-layers 9 formed of silicon having a specific resistance of about .1 to 1.0 ohm per cm. The layers 9 may be grown on the silicon layer 8 or applied in any other suitable manner. In applying the layers 9 it is important that they terminate at a point spaced from one edge of the layer 8. The layers 9 are then covered by a p-layer of silicon 10 having a specific resistance of the order of .001 ohm per cm. and a thickness of 1 to 2 microns. The positive and negative electrodes 11 and 12 are then applied to complete the structure.

With the structure as described above the silicon layer 8 has an extremely low specific resistance and has characteristics very similar to that of metal. The resistance in the horizontal direction can be neglected since the internal resistance is effected primarily by the resistance of layers 9 and the contact resistance of the electrodes 11 and 12. Thus a transducer is provided which not only produces an electric current in response to radiant energy but may be directed to either one or both sides of the structure. Since radiant energy of the longer wave-lengths passes through the laminate and to the center thereof, a considerably higher efficiency will be obtained than with known transducers. The laminate or transducer as described above is generally referred to as the n-type. In the case of p-type laminates, the center or core would be formed of p-type silicon having a low density of impurity, and then n-layers applied to the p-layer in substantially the same manner as described. In effect, therefore, the p and n layers are reversed.

The transducers described above are particularly useful as solar batteries and will afford considerably higher efficiencies than that generally obtained with known solar batteries utilizing silicon. Prior batteries have an efficiency of about 10% whereas the efficiency of the solar battery in accordance with this invention would be about 20%.

Figure 5:
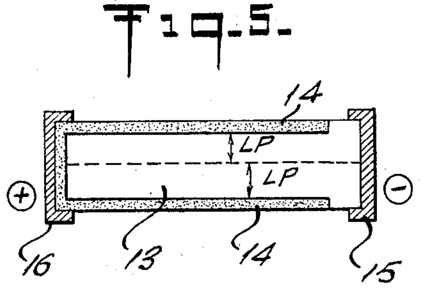
FIG. 5 is a cross-sectional view of the transducer similar to that shown in FIG. 4 and illustrating the action of the transducer when radiant energy is applied to both sides thereof.

FIG. 5 illustrates one mode of applying solar energy simultaneously to both sides of a photo-electric transducer in accordance with the invention. When using the n-type structure the silicon layer 13 which is of the n-type is provided with a thickness $2 \times LP$ wherein LP is the diffusion distance of the positive holes within a n-layer 13. A p-layer 14 is formed on each side of the layer 13 and then electrodes 15 and 16 are applied on as previously described. With the application of light applied to the upper side as shown in FIG. 5, pairs of positive holes and electrons are produced and those which lie within the range of the diffusion distance to the upper junction will diffuse to said junction where they are separated. In addition, the longer light wave lengths applied to the upper side produces pairs of positive holes and electrons within the range of the diffusion distance from the lower side of the structure. These pairs will then diffuse to the lower junction whereupon they are separated in the same manner as in connection with the upper junction. Thus when the junctions are provided on both sides of the element the energy output and consequently the efficiency, is increased.

With the structure shown in FIG. 5, light may also be applied to the lower side and the same action occurs as described above. Thus by applying light to both sides of the element the output energy will be about twice the energy obtained with known radiation devices having a single junction on one side and the other side plated with nickel or the like.

Figure 6:
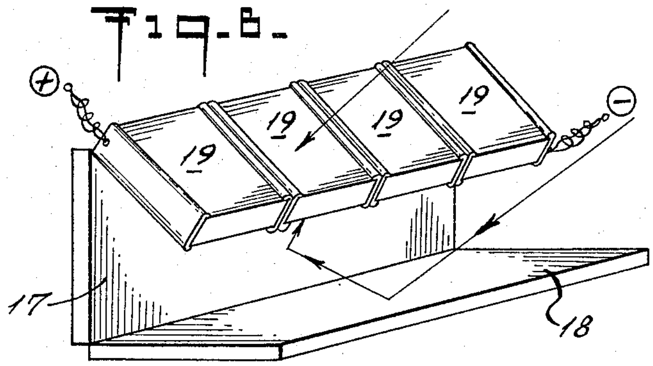
FIG. 6 illustrates apparatus in accordance with the invention for applying radiant energy to both sides of a set of series connected transducers as illustrated in previous figures.

There are various ways in which light may be applied simultaneously to both sides of the transducer in accordance with the invention. One such example is shown in FIG. 6. In this figure the transducers are denoted by the numeral 19 and four are arranged in cascade. A pair of mirrors 17 and 18 are joined one to the other at about 90 degrees and the transducers 19 are secured along one edge of the mirror 17 and at an angle of about 45 degrees thereto. Radiant energy directed toward the structure will impinge directly on one side of the transducers 19 and another portion of the radiant energy will be reflected by the mirrors 18 and 17 to the underside of the transducers 19. The energy generated by the transducers 19 is obtained from the terminals marked plus and minus.

Figure 7:
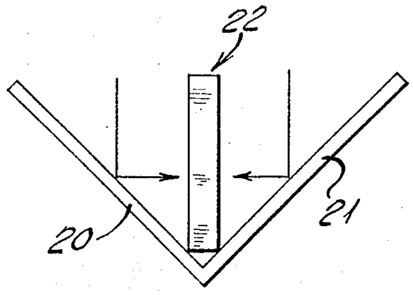
FIG. 7 illustrates a modified embodiment of the invention for applying radiant energy to both sides of a transducer.

Still another mode of directing radiation simultaneously to both sides of a transducer in accordance with the invention is shown in FIG. 7. In this figure there are a pair of mirrors 20 and 21 fixed at 90 degrees one relative to the other. The transducer 22 is disposed so that it bisects the angle between the mirrors as illustrated whereupon radiant energy is reflected from one mirror on to one side of the transducer and from the other mirror on to the other side of the transducer.

A significant aspect of the invention as described thus far resides in the fact the upper and lower junctions do not react adversely one with the other, but rather supplement one another to produce increased electric power than can be utilized in a load connected to the transducer. Another important advantage of the structure in accordance with the invention is that the transducer will operate at a considerably lower temperature than prior known devices particularly when utilizing wavelengths approximately equal to or greater than 1.1 microns.

Figure 8:
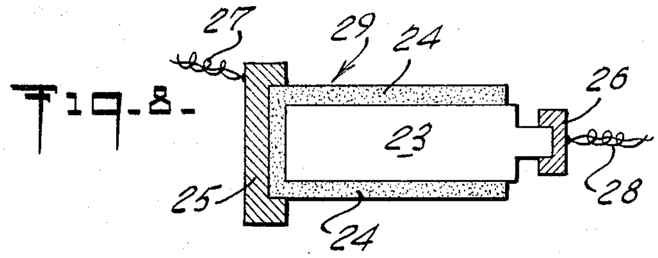
FIG. 8 is a cross-sectional view of a single cell of an atomic battery in accordance with the invention.

This invention is readily applicable for use as an improved atomic battery that will afford considerably greater efficiency than known devices. FIG. 8 illustrates one embodiment of the invention for this purpose and includes a p-type silicon body 23 having layers of lithium or phosphorus 24 fused to the side surfaces to form thin n-type layers. These layers provide p-n junctions on each side. Electrodes 25 and 26 are preferably formed by vaporizing aluminum on one end to form the positive terminal 26 and a mixture of silver and antimony on the other end to form the negative terminal 25. The terminal 25 connects both layers 24 while the terminal 26 is formed on a reduced section of the body 23 which is spaced substantially from the adjoining ends of the layers 24. Lead wires 27 and 28 are connected to the terminals 25 and 26, respectively.

Radiant energy such as beta radiation is applied to the structure 29. While beta radiation is preferable as a source of energy since the decay time is long and shielding does not present any difficult problems, it is understood that other forms of radiation may be used. The radiant energy will react on the cell 29 in much the same manner as that described in connection with the previous embodiments of the invention and generate electrical energy between the leads 27 and 28.

Figure 9:
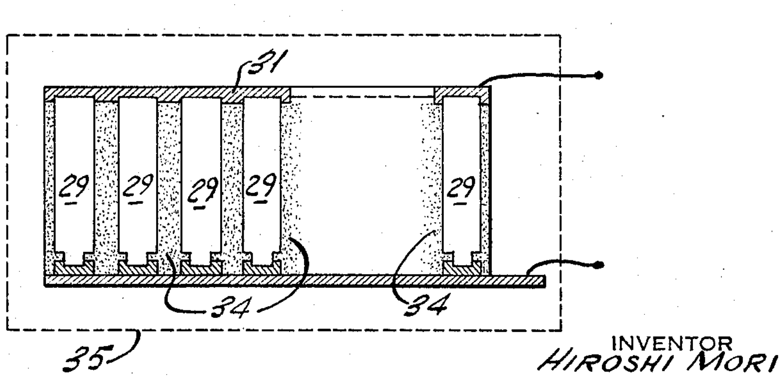
FIG. 9 is a cross-sectional view of an atomic battery utilizing a plurality of parallel connected cells.

Various methods may be utilized for applying radiant energy to both sides of the diffusion type element 29 shown in FIG. 8. One mode for the attainment of this end is illustrated in FIG. 9. In this figure a plurality of diffusion elements 29 are arranged in spaced relationship with a positive electrode 30 bridging each of the terminals 26. The terminals 26 are formed by vaporizing aluminum on the narrow end portions of the p-layers 23 as described in connection with FIG. 8 of the drawings. The n-layers 24 are bridged by the negative terminal 31, the layers 24 having first been provided with a vaporized layer of silver and antimony. Suitable lead wires 32 and 33 are connected to the bridging members.

As will be observed in FIG. 9, the individual elements 29 are positioned in spaced relationship and the spaces between the elements are filled with a radioactive material 34. Radioactive materials which have been found effective for this purpose are carbonates of strontium 90 and yttrium 90 which provide beta radiation. The entire structure is enclosed in a metal shield 35. With this structure all of the beta radiation is transformed into electric battery power and the utilization rate of the radiant energy is relatively high. Moreover, the beta radiation source has a relatively long decay time so that the unit will function effectively for extended periods. Since the radiation is applied directly to each side of the elements 29, the same advantages are obtained as discussed in the previous embodiments of the invention. It is to be understood however, that the elements 29 may be connected either in series, parallel or series-parallel depending on the particular voltage and current required.

While certain embodiments of the invention have been illustrated and described, it is understood that modifications, changes and alterations may be made without departing from the true scope and spirit thereof as defined by the appended claims.

What is claimed is:

1. A radiation sensitive transducer comprising at least two monocrystal bodies of semi-conductor material each having a first conductivity type material in the central portion extending to one edge thereof and a layer of another conductivity type material extending over two opposite surfaces of said body, said layers being ohmically connected and forming a single P-N junction with said central portion, said bodies each having a thickness between said surfaces not exceeding twice the diffusion distance of the minority carriers produced in said body by the impingement of radiant energy thereon and the said central portion of one body and the said layers of the other body having ohmic electrodes disposed in electrical contact forming an electrical series connection between said bodies.

2. A radiation sensitive transducer according to claim 1 wherein each of said bodies contains a relatively large amount of impurities and includes a layer of said first conductivity type material containing a relatively small amount of impurities on each of said opposite surfaces and underlying said layers of said another conductivity type material.

3. A radiation sensitive transducer comprising at least two monocrystal bodies of semi-conductor material each having a first conductivity type material in the central portion extending to one edge thereof and a layer of another conductivity type material extending over two opposite surfaces of said body, said layers being ohmically connected and forming a single P-N junction with said central portion, said bodies each having a thickness between said surfaces not exceeding twice the diffusion distance of the minority carriers produced in said body by the impingement of radiant energy thereon, and the said central portions of said bodies having ohmic contacts connected one to the other, said layers of each body having an ohmic contact and an electrical connection between the last said ohmic contacts, the last said connections forming a parallel electrical connection between said bodies.

4. A radiation sensitive transducer according to claim 3 wherein each of said bodies contains a relatively large amount of impurities and includes a layer of said first conductivity type material containing a relatively small amount of impurities on each of said opposite surfaces and underlying said layers of said another conductivity type material.

References Cited by the Examiner

UNITED STATES PATENTS

| | | | |
|---|---|---|---|
| 2,402,662 | 6/1946 | Ohl | 136—89 |
| 2,561,411 | 7/1951 | Pfann | 317—235 |
| 2,669,635 | 2/1954 | Pfann | 317—235 |
| 2,745,973 | 5/1956 | Rappaport | 310—3 |
| 2,788,381 | 4/1957 | Baldwin | 136—89 |
| 2,819,414 | 1/1958 | Sherwood et al. | 310—3 |
| 2,858,489 | 10/1958 | Henkels | 317—235 |
| 2,919,298 | 12/1959 | Regnier et al. | 136—89 |
| 2,965,820 | 12/1960 | Barton | 317—235 |
| 2,978,618 | 4/1961 | Myers | 317—235 |
| 2,980,831 | 4/1961 | Lehovec et al. | 317—235 |
| 2,985,805 | 5/1961 | Nelson | 317—235 |
| 3,094,633 | 6/1963 | Harries | 317—235 |

JOHN W. HUCKERT, *Primary Examiner.*

F. M. STRADER, *Examiner.*

C. F. ROBERTS, J. D. KALLAM, *Assistant Examiners.*